United States Patent [19]

Reis et al.

[11] Patent Number: 5,034,636

[45] Date of Patent: Jul. 23, 1991

[54] SENSE AMPLIFIER WITH AN INTEGRAL LOGIC FUNCTION

[75] Inventors: Richard B. Reis; James S. Golab, both of Austin, Tex.

[73] Assignee: Motorola, Inc., Schaumburg, Ill.

[21] Appl. No.: 534,562

[22] Filed: Jun. 4, 1990

[51] Int. Cl.[5] .......................... G11C 15/00; H03F 3/45
[52] U.S. Cl. ...................................... 307/530; 307/350; 365/49
[58] Field of Search ................. 307/530, 350; 365/49, 365/189.07, 205, 207, 208

[56] References Cited

U.S. PATENT DOCUMENTS

| | | | |
|---|---|---|---|
| 4,634,900 | 1/1987 | Koshizuka | 307/530 |
| 4,743,784 | 1/1988 | Obara et al. | 307/530 |
| 4,792,927 | 12/1988 | Miyamoto et al. | 365/189.07 |
| 4,823,313 | 4/1989 | Kadota | 365/49 |
| 4,825,110 | 4/1989 | Yamaguchi et al. | 307/530 |
| 4,831,287 | 5/1989 | Golab, Jr. | 307/530 |
| 4,843,264 | 6/1989 | Galbraith | 307/530 |
| 4,862,412 | 8/1989 | Fried et al. | 365/189.07 |
| 4,894,799 | 1/1990 | Hanawa et al. | 365/49 |

Primary Examiner—David Hudspeth
Assistant Examiner—Andrew Sanders
Attorney, Agent, or Firm—Paul J. Polansky

[57] ABSTRACT

A sense amplifier with an integral logic function for use in a circuit such as a tag cache portion of a microprocessor cache. In one form, the integral logic function is an exclusive-OR function. The sense amplifier senses a differential voltage developed between a differential pair of bit lines which are coupled to predetermined bit positions of a plurality of entries in a tag cache. While sensing the voltage, an exclusive-OR function is performed between the logic state of the sensed bit and a corresponding input address bit. If the input address bit matches the sensed bit, then a match signal is asserted. The value of the corresponding input address bit configures the circuit either to provide an output signal in a predetermined logic state if a true bit line signal voltage exceeds a complement bit line signal voltage, or to provide the output signal in the predetermined state if the complement bit line signal voltage exceeds the true bit line signal voltage.

13 Claims, 2 Drawing Sheets

SENSE AMPLIFIER WITH AN INTEGRAL LOGIC FUNCTION

FIELD OF THE INVENTION

This invention relates generally to sense amplifiers, and more particularly, to sense amplifiers with integral logic functions.

BACKGROUND OF THE INVENTION

Integrated circuit memories are organized in a matrix of rows and columns, with a memory cell located at each intersection of a row and a column. When accessed during a read cycle, the memory decodes an address to enable one row line. The memory cells on the enabled row line provide their contents onto bit lines, or more commonly, on differential bit line pairs. When each memory cell provides its contents onto a bit line or a bit line pair, a sense amplifier detects a logic state of the signal and amplifies it. Then, further decoding may be performed. The speed at which the decoding takes place together with the sensing time determine the overall speed of the memory. The type of decoding depends on the type and use of the memory.

For example, many microprocessors now incorporate caches, which are on-chip high-speed memories. Caches increase the performance of the microprocessor by storing on-chip the contents of memory the microprocessor is most likely to access. A microprocessor with an on-chip instruction cache, for example, stores a portion of its program in the on-chip cache. If the instruction is in the cache, the microprocessor reads it from the high-speed cache rather than from slower, off-chip memory. Similarly, a microprocessor with a data cache stores a portion of the program's data on-chip. To determine whether a microprocessor memory access is from the cache, the cache compares the address the microprocessor places on the address bus with the address of data previously stored in the cache. This comparison of addresses is done with additional memory known as the tag cache array. The contents of the tag cache array are addresses whose data is located in the cache.

In cache circuits speed is critical. The speed of the comparison between the accessed address and the contents of the tag cache array must be minimized. Several techniques are used for determining whether the accessed address is one of the addresses located in the tag cache array. For example, in a fully-associative cache, all tag cache array entries are simultaneously compared with the input address. A two-way set-associative cache, however, first uses a portion of the input address to decode two possible tag cache array entries. The predecoded entries are then sensed and corresponding bit positions are compared to the remaining address bits of the input address. If the remaining address bits in the input address match one of the two decoded tag cache entries, then a "cache hit" has occurred, and the corresponding contents of the cache array are read onto the data bus. If none of the two entries match the input address, however, a "cache miss" has occurred and data from the memory address must be fetched from off-chip memory. Between the two-way set-associative and the fully associative caches is the four-way set associative cache, which decodes a portion of the incoming address to select four possible cache entries, and then performs the further comparison. Because there is a design trade-off between microprocessor performance and circuit area, set associative caches are often preferred. In order to optimize performance of the set associative cache, sensing time must be minimized.

DESCRIPTION OF A PREFERRED EMBODIMENT

Accordingly there is provided a sense amplifier with an integral logic function for use in a circuit such as a tag cache array for a cache of a data processor. The sense amplifier comprises an input portion and an output portion. The input portion provides a first difference signal in response to a difference between a first signal and a second signal if an input signal is in a predetermined logic state, and provides a second difference signal in response to a difference between the second signal and the first signal if a complement of the input signal is in the predetermined logic state. The output portion is coupled to the input portion, and provides an output signal either in response to the first difference signal if the input signal is in the predetermined logic state, or in response to the second difference signal if the complement of the input signal is in the predetermined logic state.

In one form, the sense amplifier comprises first and second transistors having first current electrodes coupled to a virtual ground node, and respectively receiving the first and second signals on control electrodes thereof. A third transistor has a first current electrode coupled to a second current electrode of the first transistor, a control electrode, and a second current electrode coupled to a positive power supply voltage terminal. A fourth transistor has a first current electrode coupled to a second current electrode of the second transistor, a control electrode coupled to the control electrode of the third transistor, and a second current electrode coupled to a positive power supply voltage terminal. A logic portion is coupled to the first, second, third, and fourth transistors, for coupling together the gate and the first current electrode of the third transistor in response to a complement of the input signal, and for coupling together the gate and the first current electrode of the fourth transistor in response to the input signal. An output portion is coupled to the second current electrodes of the first and second transistors, for providing an output signal in response to a voltage on the second current electrode of either the first transistor or the second transistor in response to the input signal.

These and other features and advantages will be more clearly understood from the following detailed description taken in conjunction with the accompanying drawings.

DETAILED DESCRIPTION OF THE INVENTION

Figure 1:
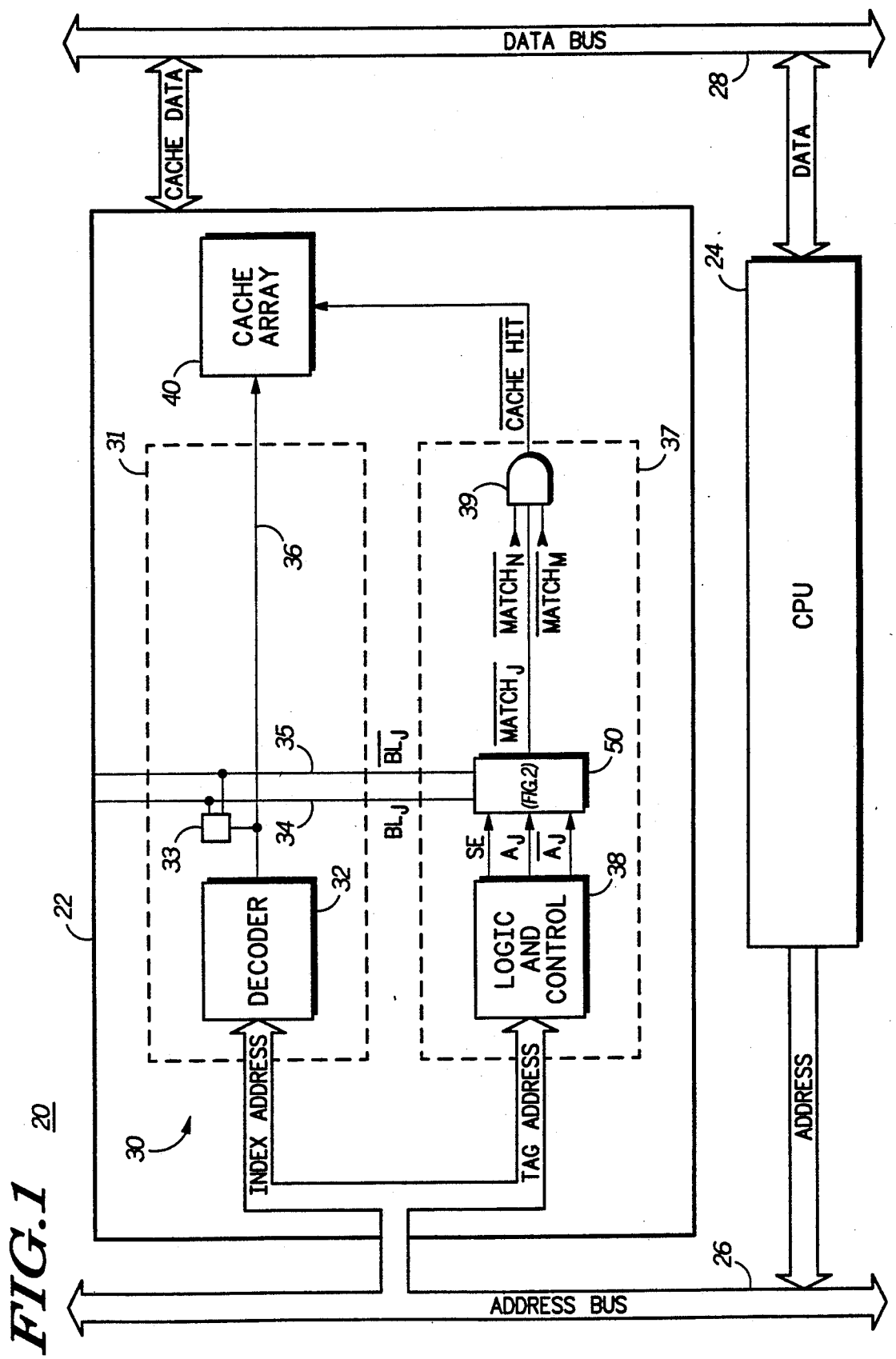
FIG. 1 illustrates in block diagram form a data processor with a tag cache incorporating an improved sense amplifier with an integral logic function.

FIG. 1 illustrates in block diagram form a data processor 20 with a tag cache 30 incorporating sense amplifier 50 with an integral logic function in accordance with the present invention. Data processor 20 comprises generally a cache 22, a CPU 24, an address bus 26, and a data bus 28. Cache 22 generally comprises tag cache 30 and a cache array 40. Tag cache 30 comprises a tag portion 31 comprising a decoder 32, a bit cell 33, a first bit line 34, a second bit line 35, and a row line 36; and a sense amplifier portion 37 comprising a logic and control block 38, an AND gate 39, and sense amplifier 50.

CPU 24 is a central processing unit of data processor 20, and performs instructions in response to a program (not shown). Control and clock signals and other blocks of data processor 20 not associated with the invention are not shown in FIG. 1. CPU 24 provides a plurality of address signals to address bus 26 in response to the program. Depending on the instruction, CPU 24 either reads from, or writes data to, data bus 28. Tag portion 31 receives a portion of the address labelled "INDEX ADDRESS". Decoder 32 decodes the INDEX ADDRESS and asserts one row line in response thereto. Row line 36, coupled to decoder 32, represents one of a plurality of row lines corresponding to all possible values for the INDEX ADDRESS. Located at intersections of each one of the row lines and a plurality of bit line pairs are memory cells such as memory cell 33, which is shown coupled to bit lines 34 and 35, and which provides signals $BL_J$ and $\overline{BL_J}$, respectively, thereon. In the illustrated embodiment, the contents of each memory cell are read differentially onto a pair of bit lines coupled to the memory cell. Differential bit line pairs are preferred for speed, but single-ended bit lines may be used in other embodiments.

The number of entries in tag portion 31 located on a row line is determined by the cache organization. For example, a four-way set-associative cache has four entries located on each row. When CPU 24 provides an address on address bus 26, decoder 32 asserts one row line, and corresponding portions of the four entries located on the decoded row are read out on bit line pairs. Subsequently, sense amplifier portion 37, coupled to the plurality of bit line pairs provided by tag portion 31, compares the value stored in each of the four tag cache entries, on the row line selected by the INDEX ADDRESS, to the remaining portion of the address, known as the "TAG ADDRESS". The logic state of the differential signal of each bit line pair is sensed and compared to a corresponding bit in the TAG ADDRESS. If a match is found, a match signal is asserted for that bit position. $MATCH_J$, for example, is asserted if the logic state of corresponding address bit "$A_J$" equals the logic state on $BL_J$ and $\overline{BL_J}$. If all bit positions match corresponding bits in the input address, then a signal labelled CACHE HIT is asserted. CACHE HIT informs cache array 40 that the address asserted on address bus 26 corresponds to a valid entry in the cache. In response to CACHE HIT, cache array 40 provides a plurality of data signals labelled "CACHE DATA" onto data bus 28. CACHE DATA is subsequently read by microprocessor 24.

Specifically in sense amplifier portion 37, logic and control block 38 receives the TAG ADDRESS and provides a select signal labelled "SE", an address signal $A_J$, and a complement of $A_J$ labelled "$\overline{A_J}$" to sense amplifier 50. Signal SE is a control signal used to select and activate sense amplifier 50. Sense amplifier 50 senses the logic state of the data provided by memory cell 33 in response to SE, and compares the logic state of the data to signal $A_J$. If there is a match, the sense amplifier 50 provides $MATCH_J$ in response. If the contents of all memory cells match corresponding bit positions of the TAG ADDRESS, the CACHE HIT signal is asserted. In sense amplifier portion 37, this function is implemented by AND gate 39. AND gate 39 receives a plurality of match signals. Shown in FIG. 1 are match signals labelled "$MATCH_N$", $MATCH_J$, and "$MATCH_M$", received on first, second, and third input terminals of AND gate 39. AND gate 39 also receives each of the additional bits corresponding to remaining bit positions in the TAG ADDRESS. In FIG. 1, the TAG ADDRESS is (M−N) bits wide, where N is the first bit position in the TAG ADDRESS, J is an intermediate bit position, and M is the last bit position.

In typical tag cache sense amplifiers, the logic state of a bit line pair is sensed and then compared with the corresponding address bit. However, in sense amplifier portion 37 each sense amplifier, such as sense amplifier 50, combines the sense amplifier and the comparison functions into a single circuit. Thus an extra delay through the comparator existing in the typical tag cache design is herein saved. Note that while FIG. 1 shows the use of sense amplifier 50 in a tag cache sense amplifier, sense amplifier 50 may be used in other memory applications or in circuits otherwise sensing a value on a signal line and subsequently performing a logic function.

Figure 2:
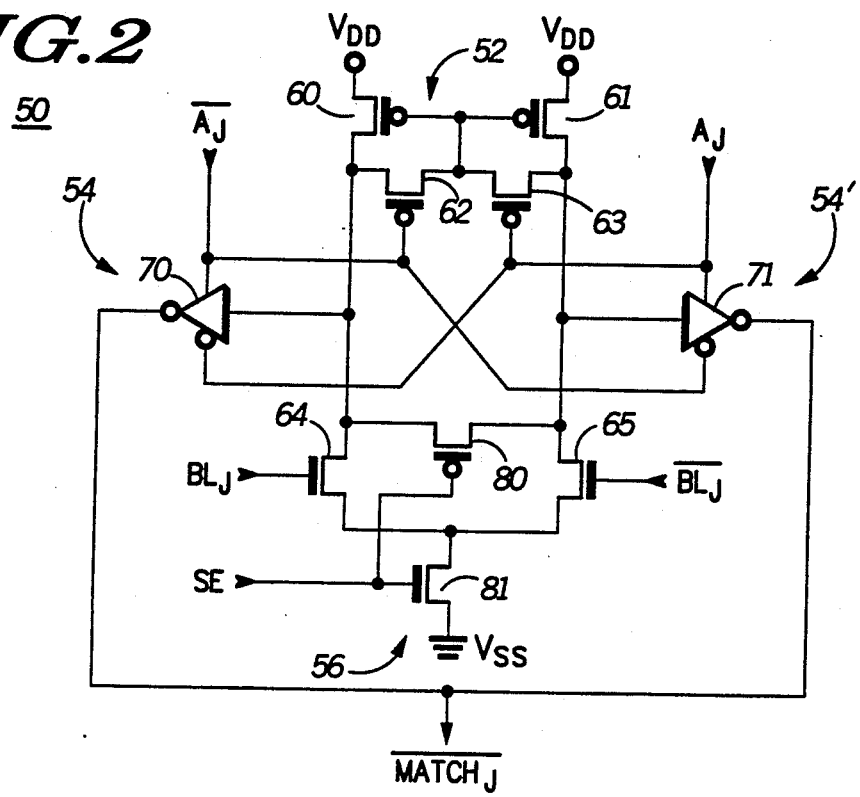
FIG. 2 illustrates in schematic diagram form the sense amplifier of FIG. 1 with an integral exclusive-OR function.

FIG. 2 illustrates in schematic diagram form sense amplifier 50 of FIG. 1 with an integral exclusive-OR function. Sense amplifier 50 comprises generally an input portion 52, a first output portion 54, a second output portion 54', and an enable portion 56. Input portion 52 comprises P-channel transistors 60, 61, 62, and 63, and N-channel transistors 64 and 65. First output portion 54 comprises a three-state inverter 70. Second output portion 54' comprises a three-state inverter 71. Enable portion 56 comprises a P-channel transistor 80, and an N-channel transistor 81.

Transistor 60 has a drain, a gate, and a source connected to a power supply voltage terminal labelled "$V_{DD}$". Transistor 61 has a source connected to $V_{DD}$, a gate connected to the gate of transistor 60, and a drain. Transistor 62 has a source connected to the gate of transistor 60, a gate for receiving address signal $A_J$, and a drain connected to the drain of transistor 60. Transistor 63 has a source connected to the gate of transistor 60, a gate for receiving address signal $\overline{A_J}$, and a drain connected to the drain of transistor 60. Transistor 64 has a drain connected to the drain of transistor 60, a gate for receiving bit line signal $BL_J$, and a source. Transistor 65 has a drain connected to the drain of transistor 61, a gate for receiving bit line signal $\overline{BL_J}$, and a source connected to the source of transistor 60. Inverter 70 has an input terminal connected to the drain of transistor 60, a positive enable input terminal for receiving address signal $\overline{A_J}$, a negative enable input terminal for receiving address signal $A_J$, and an output terminal for providing $MATCH_J$. Inverter 71 has an input terminal connected to the drain of transistor 61, a positive enable input terminal for receiving address signal $A_J$, a negative enable input terminal for receiving address signal $\overline{A_J}$, and an output terminal for providing $MATCH_J$. Transistor 80 has a source connected to the drain of transistor 60, a gate for receiving select signal SE, and a drain connected to the drain of transistor 61. Transistor 81 has a drain connected to both the source of transistor 64 and to the source of transistor 65, a gate for receiving select signal SE, and a source connected to a power supply voltage terminal labelled "$V_{SS}$". In the illustrated embodiment, $V_{DD}$ is a positive power supply voltage terminal with respect to $V_{SS}$, but this is not necessarily so in other embodiments where the conductivities of the transistors are modified.

In operation, sense amplifier 50 receives a differential signal represented by the bit line signal voltages $BL_J$ and $\overline{BL}_J$. Essentially, sense amplifier 50 is configured by address signals $A_J$ and $\overline{A}_J$, which function as control bits to sense amplifier 50. The logic state of address signal $A_J$ configures the output terminal of input portion 52. If address signal $A_J$ is a logic low, the output terminal of input portion 52 is the drain of transistor 60, and inverter 70 provides match signal $MATCH_J$. If, however, address signal $A_J$ is a logic high, the output terminal of input portion 52 is the drain of transistor 61 and inverter 71 provides match signal $MATCH_J$. Thus sense amplifier 50 senses the voltage on the bit line pair and provides match signal $MATCH_J$ in response to an exclusive-OR between address signal $A_J$ and bit line signal $BL_J$. Sense amplifier 50 performs the sensing and logic functions with a single level of logic and thus saves a gate delay.

Select signal SE enables the operation of sense amplifier 50. When select signal SE is a logic high, sense amplifier 50 is enabled. Transistor 80 is nonconductive, and transistor 81, acting as a current source, provides a voltage on the sources of transistors 64 and 65 at a virtual ground potential, substantially equal to $V_{SS}$. When select signal SE is a logic low, sense amplifier 50 is disabled. Transistor 81 is nonconductive, and transistor 80 is conductive and couples the drain of transistor 64 to the drain of transistor 65. In this way, the voltages at the input terminals of inverters 70 and 71 are equal when select signal SE is a logic low.

When address signal $A_J$ is a logic high, corresponding to a binary 1 for the $J^{th}$ bit position of the input address, inverter 71 is enabled and inverter 70 is disabled. Furthermore, transistor 63 is nonconductive and transistor 62 is conductive. The response of sense amplifier 50 when address signal $A_J$ is a logic high is illustrated by sense amplifier 50' in FIG. 3. In sense amplifier 50', inverter 70 and transistor 63 are removed, and the source-drain path of transistor 62 is replaced with a direct connection. Transistors 60', 61', 64', 65', inverter 71', and transistors 80' and 81' correspond to similarly unprimed numbered elements in FIG. 2.

When select signal SE is a logic high, transistor 81' is conductive, and provides a virtual ground on the sources of transistors 64' and 65' substantially equal to $V_{SS}$. Transistors 64' and 65' form an input pair, with the difference in voltage between bit line signals $BL_J$ and $\overline{BL}_J$ controlling the conduction of current. As bit line signal $BL_J$ exceeds bit line signal $\overline{BL}_J$, the gate-to-source voltage ($V_{GS}$) of transistor 64' increases, and the drain-to-source current $I_{DS}$ through transistor 64' increases. The $I_{DS}$ of transistor 64' is mirrored by transistor 60' to transistor 61'. Substantially the same $I_{DS}$ flows through transistor 65' as through transistor 64', but the $V_{GS}$ is less. As the drain-to-source voltage, $V_{DS}$, of transistor 65' increases, the voltage on the drain of transistor 65' increases. The ratio of the gate sizes of P-channel transistors 60' and 61' to the N-channel transistors 64' and 65', respectively, is such that a small difference in voltage between bit line signals $BL_J$ and $\overline{BL}_J$ causes the voltage on the drain of transistor 65' to switch by a large margin and to rise to substantially $V_{DD}$. If bit line signal $BL_J$ exceeds bit line signal $\overline{BL}_J$, the voltage on the drain of inverter 71' is above its switchpoint, and match signal $MATCH_J$ is asserted. If bit line signal $\overline{BL}_J$ exceeds bit line signal $BL_J$, the voltage on the input terminal of inverter 71' is below its switchpoint, and $MATCH_J$ is negated. Thus, the drain of transistor 65' is the output node of sense amplifier 50'.

Referring again to FIG. 2, when address signal $A_J$ is a logic low, corresponding to a binary zero for the $J^{th}$ bit position of the input address, inverter 70 is enable and inverter 71 is disabled. Furthermore, transistor 62 is nonconductive and transistor 63 is conductive. The response of sense amplifier 50 when address signal $A_J$ is a logic low is illustrated by sense amplifier 50'' in FIG. 4. In sense amplifier 50'', inverter 71 and transistor 62 are removed, and the source-drain path of transistor 63 is replaced with a direct connection. Transistors 60'', 61'', 64'', 65'', inverter 71'', and transistors 80'' and 81'' correspond to similarly unprimed numbered elements in FIG. 2.

When select signal SE is a logic high, transistor 81'' is conductive, and provides a virtual ground on the sources of transistors 64'' and 65'' substantially equal to $V_{SS}$. Transistors 64'' and 65'' form an input pair, with the difference in voltage between bit line signals $BL_J$ and $\overline{BL}_J$ controlling the conduction of current. As bit line signal $\overline{BL}_J$ exceeds bit line signal $BL_J$, the gate-to-source voltage, $V_{GS}$, of transistor 65'' increases, and the drain-to-source current, $I_{DS}$, increases. The $I_{DS}$ of transistor 65'' is mirrored by transistor 61'' to transistor 60''. Since substantially the same $I_{DS}$ flows through transistor 64'' as through transistor 65'', but the $V_{GS}$ is less, the drain-to-source voltage $V_{DS}$ of transistor 64'' increases, and the voltage on the drain of transistor 64'' increases, substantially to $V_{DD}$. If bit line signal $\overline{BL}_J$ exceeds bit line signal $BL_J$, the voltage on the drain of inverter 70'' is above its switchpoint, and match signal $MATCH_J$ is asserted. If bit line signal $BL_J$ exceeds bit line signal $\overline{BL}_J$, the voltage on the input terminal of inverter 70'' is below its switchpoint, and $MATCH_J$ is negated. The drain of transistor 64'' is the output node of sense amplifier 50''.

Figures 3, 4:
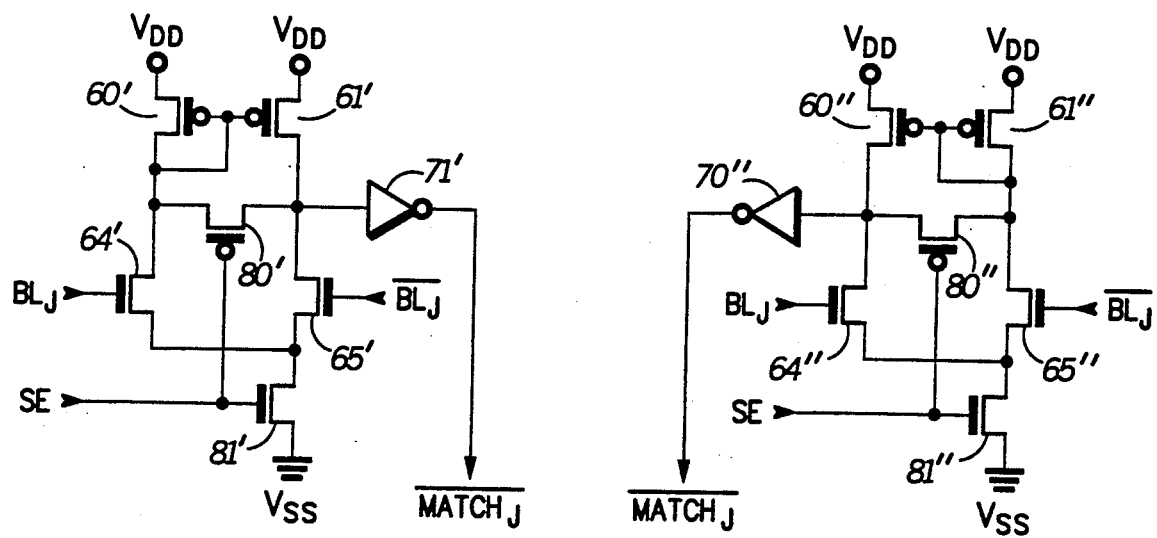
FIG. 3 illustrates in schematic diagram form a sense amplifier corresponding to the sense amplifier of FIG. 2 when the input $A_J$ is equal to binary one.
FIG. 4 illustrates in schematic diagram form a circuit corresponding to the circuit of FIG. 2 when the input $A_J$ is equal to binary zero.

Referring now again to FIG. 2, and considering the operation of sense amplifier 50 as more specifically illustrated by FIG. 3 and FIG. 4, one can see that match signal $MATCH_J$ is provided as the inverse of bit line signal $BL_J$ if address signal $A_J$ is a binary one, and as the inverse of bit line signal $\overline{BL}_J$ if address signal $A_J$ is a binary zero. This is precisely an exclusive-OR of the sensed voltage between bit line signals $BL_J$ and $\overline{BL}_J$, and address signal $A_J$. Sense amplifier 50 does not directly provide the value of the bit stored in the corresponding memory cell, but the value may be obtained by performing an exclusive-OR operation between match signal $MATCH_J$ and address signal $A_J$.

It should be apparent that a sense amplifier with an integral logic function has been provided. In the illustrated embodiment, the sense amplifier performs an exclusive-OR function while sensing the contents of a memory cell in a tag cache array. However, other embodiments in which the sense amplifier senses a voltage and simultaneously performs a logic function are possible. Although the illustrated logic function is an exclusive-OR, other logic functions are possible. For example, inverters 70 and 71 could be replaced with noninverting three-state buffers. Also, although sense amplifier 50 senses a differential voltage between bit line signals BL/ and BL/ in the illustrated embodiment, the sense amplifier could be configured to receive a single-ended signal. To sense a single-ended signal, the control electrode of transistor 65 could receive a reference voltage, and the single-ended input signal may be received on the gate or control electrode of transistor 64. Note that the order of activation of the input signals, SE, A/ and A/, and BL/ and BL/, does not affect the function of sense amplifier 50. However, sense amplifier 50 is fastest when the input signals are received in the following order: first SE, followed by A/ and A/, followed by BL/ and BL/.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

We claim:

1. A sense amplifier with an integral logic function, comprising:

input means, for providing a first difference signal in response to detecting a difference between a first input signal and a second input signal when a control signal coupled thereto is in a predetermined logic state, and for providing a second difference signal in response to detecting a difference between said second input signal and said first input signal when a complement of said control signal is in said predetermined logic state;

output means coupled to said input means, for providing an output signal in response to said first difference signal or said second difference signal; and enabling means coupled to said input means, for enabling the sense amplifier in response to a select signal, comprising:

a first transistor having a first current electrode coupled to said first difference signal, a control electrode for receiving said select signal, and a second current electrode coupled to said second difference signal; and a second transistor having a first current electrode coupled to said input means, a control electrode for receiving said select signal, and a second current electrode coupled to a first power supply voltage terminal.

2. The sense amplifier of claim 1 wherein said input means comprises:

a third transistor having a first current electrode coupled to a second power supply voltage terminal, a control electrode, and a second current electrode for providing said first difference signal;

a fourth transistor having a first current electrode coupled to said second power supply voltage terminal, a control electrode coupled to said control electrode of said third transistor, and a second current electrode for providing said second difference signal;

a fifth transistor having a first current electrode coupled to said second current electrode of said third transistor, a control electrode for receiving said control signal, and a second current electrode coupled to said control electrode of said third transistor;

a sixth transistor having a first current electrode coupled to said second current electrode of said fourth transistor, a control electrode for receiving said complement of said control signal, and a second current electrode coupled to said control electrode of said third transistor;

a seventh transistor having a first current electrode coupled to said second current electrode of said third transistor, a control electrode for receiving said second input signal, and a second current electrode coupled to said first current electrode of said second transistor; and an eighth transistor having a first current electrode coupled to said second current electrode of said fourth transistor, a control electrode for receiving said first input signal, and a second current electrode coupled to said first current electrode of said second transistor.

3. The sense amplifier of claim 2 wherein said output means comprises:

a first inverter having an input terminal coupled to said second current electrode of said third transistor, a positive enable input terminal for receiving said control signal, a negative enable input terminal for receiving said complement of said control signal, and an output terminal for providing said output signal; and a second inverter having an input terminal coupled to said second current electrode of said fourth transistor, a positive enable input terminal for receiving said complement of said control signal, a negative enable input terminal for receiving said control signal, and an output terminal coupled to said output terminal of said first inverter.

4. In a data processor having means for storing data, a circuit comprising:

first and second input transistors respectively having first current electrodes coupled to a virtual ground node, and respectively receiving first and second signals on control electrodes thereof;

a third transistor having a first current electrode coupled to a second current electrode of said first transistor, a control electrode, and a second current electrode coupled to a positive power supply voltage terminal;

a fourth transistor having a first current electrode coupled to a second current electrode of said second transistor, a control electrode coupled to said control electrode of said third transistor, and a second current electrode coupled to said positive power supply voltage terminal; and logic means coupled to said first, second, third, and fourth transistors, for coupling together said control electrode and said first current electrode of said third transistor in response to a complement of a control signal, and for coupling together said control electrode and said first current electrode of said fourth transistor in response to said control signal.

5. The circuit of claim 4 further comprising output means, said output means for providing said output signal either from said voltage on said second current electrode of said first transistor in response to a complement of a third signal, or from said voltage on said second current electrode of said second transistor in response to said third signal.

6. The circuit of claim 5 wherein said third signal is equal to said control signal.

7. In a data processor having means for storing data, a method of simultaneously performing a logic function and a compare operation in a single circuit comprising the steps of:

enabling the circuit for operation;

making conductive either a first input transistor receiving a first input signal, or a a second input transistor receiving a second input signal, first current electrodes of said first and second transistors each coupled to a negative power supply voltage terminal when the circuit is enabled;

selectively coupling second current electrodes of said first and second input transistors substantially to a positive power supply voltage terminal in response to first and second control signals, respectively; and providing an output signal either in response to a difference between said first input signal and said second input signal if said first control signal assumes a predetermined logic state, or in response to a difference between said second input signal and said first input signal if said second control signal assumes said predetermined logic state.

8. A sense amplifier with an integral logic function, comprising:

first and second transistors each having a first current electrode coupled to a virtual ground node, and a control electrode for receiving first and second signals, respectively, each transistor having a second current electrode respectively coupled to first and second nodes; and means coupled to said second current electrodes of said first and second transistors, for selectively mirroring either a current conducted through said second transistor into said first node, or a current conducted through said first transistor into said second node, respectively in response to a control signal and a complement of said control signal.

9. The sense amplifier of claim 8 wherein said means comprises:

a third transistor having a first current electrode coupled to a power supply voltage terminal, a control electrode, and a second current electrode coupled to said second current electrode of said first transistor;

a fourth transistor having a first current electrode coupled to said power supply voltage terminal, a control electrode coupled to said control electrode of said third transistor, and a second current electrode coupled to said second current electrode of said second transistor;

a fifth transistor having a first current electrode coupled to said control electrodes of said third and fourth transistors, a control electrode for receiving said complement of said control signal, and a second current electrode coupled to said second current electrode of said third transistor; and a sixth transistor having a first current electrode coupled to said control electrodes of said third and fourth transistors, a control electrode for receiving said control signal, and a second current electrode coupled to said second current electrode of said fourth transistor.

10. The sense amplifier of claim 8 further comprising enabling means coupled to said first and second transistors, for enabling the sense amplifier in response to a select signal.

11. The sense amplifier of claim 10 wherein said enabling means comprises:

a seventh transistor having a first current electrode coupled to said second current electrode of said first transistor, a control electrode for receiving said select signal, and a second current electrode coupled to said second current electrode of said second transistor; and an eighth transistor having a first current electrode coupled to said first current electrodes of said first and second transistors at said virtual ground, a control electrode for receiving said select signal, and a second current electrode coupled to a second power supply voltage terminal.

12. The sense amplifier of claim 8 further comprising output means coupled to said first and second nodes, for providing an output signal in response to either a voltage at said second node if said control signal is active, or a voltage at said first node if said control signal is inactive.

13. The sense amplifier of claim 12 wherein said output means comprises:

a first inverter having an input terminal coupled to said first node, a positive enable input terminal for receiving said complement of said control signal, a negative enable input terminal for receiving said control signal, and an output terminal for providing said output signal; and a second inverter having an input terminal coupled to said second node, a positive enable input terminal for receiving said control signal, a negative enable input terminal for receiving said complement of said control signal, and an output terminal coupled to said output terminal of said first inverter.

* * * * *